United States Patent [19]
Sokolovsky et al.

[11] Patent Number: 4,916,523
[45] Date of Patent: Apr. 10, 1990

[54] ELECTRICAL CONNECTIONS VIA UNIDIRECTIONAL CONDUCTIVE ELASTOMER FOR PIN CARRIER OUTSIDE LEAD BOND

[75] Inventors: Paul J. Sokolovsky, Sunnyvale; John Hunter, San Jose; James L. Hayward, Sunnyvale, all of Calif.

[73] Assignee: Advanced Micro Devices, Inc., Sunnyvale, Calif.

[21] Appl. No.: 245,501

[22] Filed: Sep. 19, 1988

[51] Int. Cl.4 .................. H01L 23/02; H01L 23/48; H01L 29/84; H02G 13/08
[52] U.S. Cl. ................................ 357/74; 357/68; 357/26; 174/52.1
[58] Field of Search .................... 357/74, 68, 26; 174/52.1

[56] References Cited

U.S. PATENT DOCUMENTS 4,252,990 2/1981 Sado .................... 174/52.1
4,616,406 10/1986 Brown .................. 357/68

FOREIGN PATENT DOCUMENTS 114361 9/1981 Japan .................... 357/74
279164 12/1986 Japan .................... 357/74

Primary Examiner—Rolf Hille
Assistant Examiner—Robert P. Limanek
Attorney, Agent, or Firm—Davis Chin

[57] ABSTRACT

A PGA integrated circuit package includes a package substrate (12), a unidirectional electrically conductive elastomeric layer (14), a plastic tape layer (16) having a centrally disposed chip (18), an insulator layer (20), and a cover member (22). A plurality of metal terminal pins (24) extend from a bottom surface of the substrate (12) and protrude slightly above a top surface thereof to form terminal pin ends (30). The elastomeric layer (14) is deposited over the substrate (12) for engagement with the terminal pin ends (30). The tape layer (16) and the chip (18) are deposited over the elastomeric layer (14). The tape layer (16) has a metalized trace pattern deposited on its bottom surface. The metalized trace pattern terminates at its outer ends with spaced apart metal terminal pads (32) which are in substantially vertical alignment with the respective terminal pin ends (30). The insulator layer (20) and the cover member (22) are compressed to establish electrical interconnection between the terminal pads and the respective terminal pin ends through the elastomeric layer (14).

3 Claims, 1 Drawing Sheet

ELECTRICAL CONNECTIONS VIA UNIDIRECTIONAL CONDUCTIVE ELASTOMER FOR PIN CARRIER OUTSIDE LEAD BOND

BACKGROUND OF THE INVENTION

This invention relates generally to semiconductor integrated circuit packaging and more particularly, it relates to a pin grid array integrated circuit package which has an improved electrical connection means for providing electrical interconnection between terminal pads at the outer ends of a metalized trace pattern formed on a plastic tape circuit and terminal pin ends located on a package substrate.

Due to the increasing commercial need for high density packaging for large scale integration (LSI devices), there has been developed in the industry a common arrangement referred to in the art as a pin grid array (PGA) integrated circuit package. The PGA integrated circuit package includes generally a package substrate having a rectangular or square configuration. A plurality of metal terminal pins extend outwardly from the bottom surface of the package substrate and may protrude slightly above the top surface thereof. The integrated circuit package varies in size dependent upon the number of terminal pins which could be between 68 to 410. The plurality of terminal pins are disposed in the form of rows and columns so as to provide a matrix array.

In order to provide electrical connection between the semiconductor chip or die and terminal pins of the package substrate, the PGA integrated circuit package typically also inlcudes a plastic tape circuit having a metalized trace pattern formed on its bottom surface. The metalized trace pattern is comprised of a plurality of spaced apart conductive leads terminating at their outer ends with spaced apart metal terminal pads. The terminal pads are located in alignment or registration with the slightly protruding terminal pin ends of the package substrate. Permanent mechanical joinder between the terminal pads and terminal pin ends has been effected heretofore by a number of conventional metallurgical bonding procedures such as laser welding, ultrasonic welding, or the like on automatic equipment.

As the number of terminal pins on the PGA integrated circuit package grows, the cost of the automatic equipment required to perform such metallurgical bonding procedure is also increased. Further, in order to provide reliable bonding connections there is required a precise alignment of the terminal pads to the corresponding slightly protruding terminal pin ends. In view of the high number of terminal pads to be bonded, there is an increased possibility that at least one or more of the bonding connections will be defective causing the assembled PGA package to be rejected. If the defective bonding connections are to be repaired, then there is required a major rework process and thus additional labor expense is incurred thereby increasing manufacturing costs.

It is therefore believed what is needed is a pin grid array integrated circuit package which has an improved electrical connection means for providing electrical interconnection between the terminal pads and the terminal pin ends. The electrical connection means of the present invention comprises an electrically conductive elastomeric material which establishes electrical interconnection between the terminal pads and the corresponding metal terminal pin ends. As a result, the critical alignment of the terminal pads and terminal pin ends has been eliminated. Further, in the event of a defective component, the repair and/or replacement of components in the instant PGA chip package has been made easier and more simplified.

SUMMARY OF THE INVENTION

Accordingly, it is a general object of the present invention to provide a PGA integrated circuit package having an improved electrical connection means which is relatively simple and economical to manufacture and assemble, but yet overcomes the disadvantages of the prior art PGA packages.

It is an object of the present invention to provide a PGA integrated circuit package which has an improved electrical connection means for providing electrical interconnection between terminal pads at the outer ends of a metalized trace pattern formed on a plastic tape circuit and terminal pin ends located on a package substrate.

It is still another object of the present invention to provide a PGA integrated circuit package which eliminates the need of critical alignment of the terminal pads and the terminal pin ends.

It is still another object of the present invention to provide a PGA integrated circuit package in which the repair and/or replacement of components therein is easier and more simplified.

It is yet still another object of the present invention to provide a PGA integrated circuit package which includes a unidirectional electrically conductive elastomeric material which establishes electrical interconnection between the terminal pads and the corresponding terminal pin ends.

In accordance with these aims and objectives, the present invention is concerned with the provision of a PGA integrated circuit package which includes a package substrate, a unidirectional electrically conductive elastomeric layer, a plastic tape layer having a centrally disposed semiconductor chip, an insulator layer, and a cover member. The package substrate is formed of a generally rectangular configuration and has top and bottom surfaces. A plurality of metal terminal pins extend from the bottom surface of the substrate and protrude slightly above the top surface thereof to form terminal pin ends. The elastomeric layer is deposited over the substrate for engagement with the terminal pin ends. The tape layer and chip are deposited over the elastomeric layer. The tape layer has a metalized trace pattern deposited on its bottom surface. The metalized trace pattern terminates at its outer ends with spaced apart metal terminal pads which are in substantially vertical alignment with the respective terminal pin ends.

During assembly, the insulator layer and cover member are used to compress the terminal pads and the elastomeric layer with the terminal pin ends to establish electrical interconnection between the terminal pads and the respective terminal pin ends through the elastomeric layer.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
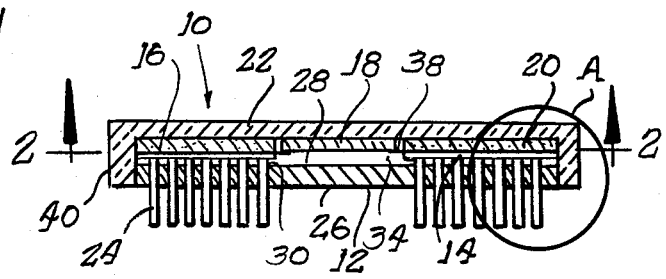
FIG. 1 is a cross-sectional view of a PGA integrated circuit package of the present invention.

Referring now in detail to the various view of the drawings, there is shown in FIG. 1 a cross-sectional view of a pin grid array (PGA) integrated circuit package 10 of the present invention. The PGA integrated circuit package 10 comprises a base unit 12, an electically conductive layer 14, a plastic tape circuit 16, a semiconductor integrated circuit chip or die 18, an insulator layer 20, and a cover or lid member 22.

The base unit 12 defines a package substrate having a generally rectangular or square configuration and is preferably formed of a thermoplastic material to incorporate a plurality of metal terminal pins 24 when molded, such as with conventional injection molding equipment. The terminal pins 24 extend from the bottom surface 26 of the package substrate 12 and protrude slightly above the top surface 28 thereof to form terminal pin ends or posts 30. The four sides of the package substrate 12 vary in dimensions dependent upon the number of terminal pins 24 which could be in the range of 68 to 410 pins. The plurality of terminal pins 24 are disposed on all four sides of the rectangular package substrate 12 in the form of rows and columns so as to provide a matrix array.

The electrically conductive layer 14 is shaped in conformity with the package substrate 12 so that the conductive layer 14 fits over the terminal pin ends 30 protruding slightly above the top surface 28 of the package substrate 12 within the four sides thereof. The electrically conductive layer 14 comprises a flat sheet of an elastomeric material which contains electrically conductive metal particles. Conduction paths of the electrically conductive elastomer 14 used in this invention are formed by compressing the elastomer so as to cause unidirectional conduction. In this instance, the desired conductivity is made to be in the Z-direction which is transverse to the x-y plane of the electrically conductive elastomeric layer 14. Such unidirectional electrically conductive elastomeric sheets are commercially available from Chomerics of Woburn, Massachusetts under their Part No. Chonector 1710.

Figure 2:
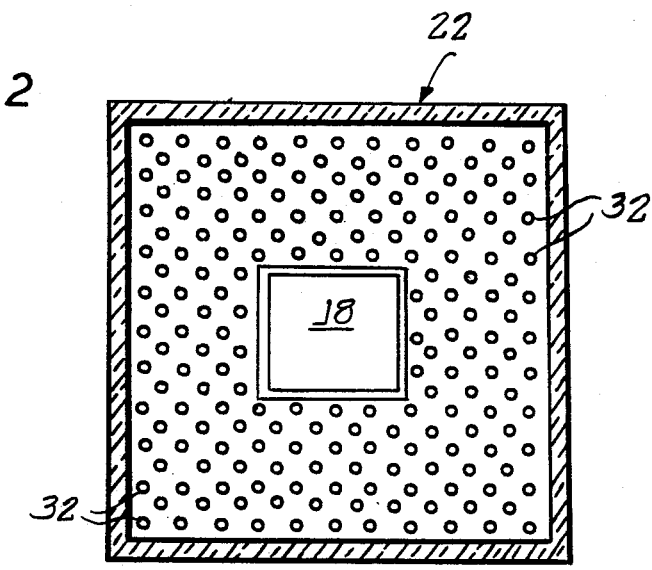
FIG. 2 is a plan view of the PGA package of FIG. 1, taken along the lines 2—2, showing the terminal pad pattern of the tape circuit.
Figure 3:
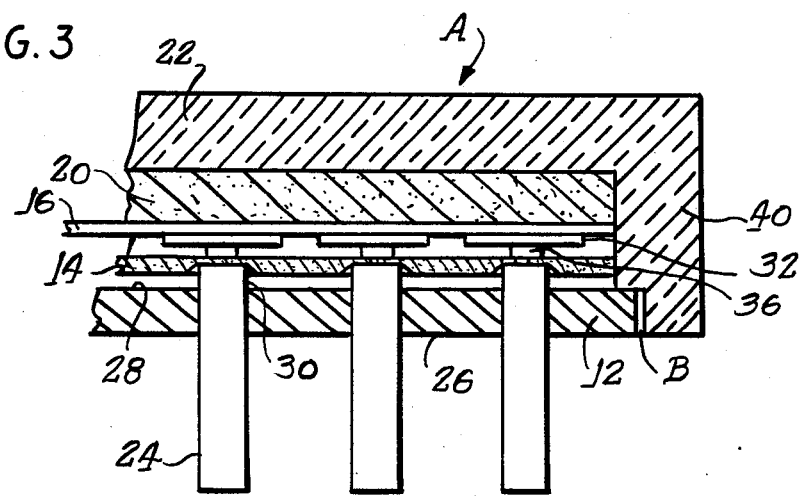
FIG. 3 is an enlarged view of the encircled portion of FIG. 1.

The tape circuit 16 comprises a plastic tape layer having a metalized trace pattern deposited on the bottom surface of the plastic layer. The outer ends of the metalized trace pattern terminate at spaced apart metalized terminal pads 32 (FIGS. 2 and 3). The terminal pad pattern of the tape circuit 16 can be best seen from FIG. 2 of the drawings. As is shown in FIG. 3, the terminal pads 32 are disposed so as to be in substantially vertical alignment or registration above the corresponding terminal pin ends 30 slightly protruding from the package substrate 12. The metalized trace pattern includes a plurality of copper conductor runs or leads (not shown) extending inwardly from the terminal pads 32 towards an outer lead bond area of a lead bond frame for establishing electrical connection with the die 18.

The plastic tape circuit 16 is formed with a central opening 34 for receiving the semiconductor chip or die 18. The metal terminal pads 32 are preferably formed with a bump or dimple 36 on its bottom surface. The dimple 36 defines a relatively small pressurized contact area for producing a concentration of force on the unidirectional electrically conductive elastomeric layer 14 during assembly.

The insulator layer 20 functions as a spacer between the plasic tape circuit 16 and the cover member 22. The insulator layer 20 is also formed with a central opening 38 for receiving the die 18. The cover member or lid 22 is of a generally rectangular structure conforming to the configuation of the package substrate 12. The cover member 22 preferably may also be formed of a thermoplastic material and has side flanges 40 which can be hermetically sealed or bonded to the package substrate 12 so as to prevent exposure to the atmospheric environment. The bonding of the cover member 22 to the package substrate 12 can be accomplished by any number of conventional means such as heat-bonding, ultrasonic welding, or adhesive bonding with an epoxy adhesive.

In assembly, the semiconductor chip or die 18 can be first secured to the plastic tape circuit 16 by a known tape automated bonding procedure so as to establish electrical connection between the die containing electrical circuits and the terminal pads 32 on the metalized trace pattern. The electrically conductive elastomeric layer 14 is placed on the top surface of the package substrate 12 and rests directly upon the slightly protruding terminal pin ends 30 formed in the substrate. The elastomeric layer 14 contains the electrically conductive metal particles which are vertically aligned in the Z-direction.

The assembled die and tape circuit are then deposited on the top surface of the elastomeric layer 14. Next, the insulator layer 20 is placed over the tape circuit 16 and surrounds the periphery of the die 18. The cover member 22 is then placed over the insulator layer 20 and is pushed downwardly in the direction of the arrow A. As a result, the electrically conductive elastomeric layer 14 is compressed to provide pressurized contact areas or points so as to establish electrical interconnection between each of the terminal pads 32 on the metalized trace pattern and the corresponding terminal pin ends 30 on the package substrate 12. Finally, the lower ends of the flange 40 of the cover member 22 is suitably bonded to the substrate at area B.

From the foregoing detailed description, it can thus be seen that the above described embodiment provides a PGA integrated circuit package which can be easily manufactured and assembled, and provides an improved electrical connection between the terminal pads of the metalized trace pattern and the terminal pin ends of the package substrate. Therefore, the permanent mechanical bonding process of the prior art (i.e., metallurgical bonding) for establishing electrical interconnection of the terminal pads and the terminal pin ends has been eliminated. This improvement is realized by the use of a unidirectional (Z-direction) electrically conductive elastomeric layer which is disposed between the terminal pads and the terminal pin ends. During assembly the terminal pads, elastomeric layer, and terminal pin ends are compressed together, thereby establishing electrical interconnection between the terminal pads and the corresponding terminal pin ends via the elastomeric layer.

As can best be seen from FIG. 3 showing the assembled PGA chip package, there are only electrical conductive paths in the vertical direction between each of the terminal pads and its respective vertically aligned terminal pin ends due to the increased pressure contact points created during assembly. As a result, the conductivity between adjacent terminal pin ends is essentially zero. In view of this, there is less need of a precise alignment between the terminal pads and the terminal pin ends which increases the probability that proper electrical contact will be achieved.

In the event that a chip or tape circuit is defective, the cover member 22 can be removed by conventional means from the package substrate 12, and the chip and tape circuit may be lifted and a replacement chip or tape circuit can be inserted. Finally, the cover member 22 is rebonded to the package substrate. Consequently, the repair process is greatly simplified and thus reduces costs by the fact that the terminal pads are not permanently bonded to the terminal pin ends.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A PGA integrated circuit package comprising:

a package substrate (12) being formed of a generally rectangular configuration and having top and bottom surfaces;

a plurality of metal terminal pins (24) extending from the bottom surface of said package substrate (12) and protruding slightly above the top surface thereof to form terminal pin ends (30);

a unidirectional electrically conductive elastomeric layer (14) being deposited over said substrate (12) for engagement with said terminal pin ends (30);

a plastic tape layer (16) having a centrally disposed semiconductor chip (18), said tape layer and chip being deposited over said elastomeric layer (14), said tape layer (16) having a metalized trace pattern deposited on its bottom surface, said metalized trace pattern terminating at its outer ends with spaced apart metal terminal pads (32) which are in substantially vertical alignment with said respective terminal pin ends (30);

said terminal pads (32) including a dimple (36) formed on its bottom surface to create contact points to facilitate proper electrical contact;

an insulator layer (20) being deposited over said tape layer (16) and said semiconductor chip (18);

a cover member (22) having a generally rectangular configuration and being deposited over said insulator layer (20); and said insulator (16) and said cover member (22) being compressed to establish only electrical conductive paths in the vertical direction between the dimples on said terminal pads and said respective terminal pin ends through said elastomeric layer (14) due to the pressurized contact points.

2. A chip package as claimed in claim 1, wherein said package substrate (12) is formed of a thermoplastic material in which said terminal pins (24) are molded therein.

3. A chip package as claimed in claim 2, where said cover member (22) is formed of a thermoplastic material and is bonded to said plastic substrate (12).

* * * * *